United States Patent
Tseng et al.

(10) Patent No.: US 8,164,042 B2
(45) Date of Patent: Apr. 24, 2012

(54) COLOR FILTER ARRAYS AND IMAGE SENSORS USING THE SAME

(75) Inventors: Chi-Xiang Tseng, Hsinchu (TW); Chin-Poh Pang, Hsinchu (TW); Cheng-Lin Yang, Hsinchu (TW); Wu-Chieh Liu, Keelung (TW)

(73) Assignee: VisEra Technologies Company Limited, Hsinchu (TW)

( * ) Notice: Subject to any disclaimer, the term of this patent is extended or adjusted under 35 U.S.C. 154(b) by 284 days.

(21) Appl. No.: 12/266,047

(22) Filed: Nov. 6, 2008

(65) Prior Publication Data
US 2010/0108866 A1 May 6, 2010

(51) Int. Cl.
*H01J 3/14* (2006.01)
(52) U.S. Cl. ......... 250/226; 348/272; 348/273; 348/280
(58) Field of Classification Search .................. 250/226, 250/208.1; 348/272, 273, 279, 226
See application file for complete search history.

(56) References Cited

U.S. PATENT DOCUMENTS

| 6,008,511 | A | 12/1999 | Tokumitsu et al. |
| 2003/0086008 | A1* | 5/2003 | Nagano .......................... 348/272 |
| 2005/0041313 | A1* | 2/2005 | Stam et al. .................... 359/877 |
| 2007/0272836 | A1* | 11/2007 | Higashitsutsumi et al. .. 250/226 |
| 2008/0084376 | A1 | 4/2008 | Hirota et al. |
| 2008/0128598 | A1* | 6/2008 | Kanai et al. ................... 250/226 |
| 2008/0174849 | A1* | 7/2008 | Asao ............................. 359/256 |

FOREIGN PATENT DOCUMENTS
JP  60-254977  12/1985

* cited by examiner

*Primary Examiner* — Tony Ko
(74) *Attorney, Agent, or Firm* — Muncy, Geissler, Olds & Lowe, PLLC

(57) ABSTRACT

Color filter arrays (CFA) and image sensors using same are provided. A color filter array includes a plurality of first color filter patterns respectively interlaced with a plurality of second color filter patterns, wherein the first and second color filter patterns comprise a plurality of color filters of at least three different colors of red (R), green (G) and blue (B) filters, and the first and second color filter patterns are not mirror symmetrical, and a blue (B) filter in one of the first color filter patterns is adjoined by a red (R) filter in one of the second color filter patterns adjacent thereto and/or a red (R) filter in one of the first color filter patterns is adjoined by a blue filter in one of the color filter patterns adjacent thereto.

22 Claims, 13 Drawing Sheets

| R | G | R | G |
|---|---|---|---|
| G | B | G | B |
| R | G | R | G |
| G | B | G | B |

FIG. 1 (PRIOR ART)

| Cy | Ye | Cy | Ye |
|----|----|----|----|
| Ye | Mg | Ye | Mg |
| Cy | Ye | Cy | Ye |
| Ye | Mg | Ye | Mg |

FIG. 2 (PRIOR ART)

COLOR FILTER ARRAYS AND IMAGE SENSORS USING THE SAME

BACKGROUND OF THE INVENTION

1. Field of the Invention

The invention relates to image sensors, and more particularly to a color filter array for improving color imbalance in different regions of an image sensor.

2. Description of the Related Art

Image sensors are necessary components in many optoelectronic devices, including digital cameras, cellular phones, and toys. Conventional image sensors include both charge coupled device (CCD) image sensors and complementary metal oxide semiconductor (CMOS) image sensors.

An image sensor typically includes a plane array of pixel cells, wherein each pixel cell comprises a photogate, photoconductor or a photodiode having a doped region for accumulating a photo-generated charge.

A periodic pattern of dyes of different colors is superimposed over the plane array of pixel cells. This pattern is known as a color filter array (CFA). A plurality of microlenses of a square or a circular shape can be optionally superimposed over the color filter array (CFA) to focus light onto one initial charge accumulation region of each of the pixel cells. Using the microlenses may significantly improve the photosensitivity of the image sensor.

FIG. 1 shows a conventional two-dimensional color filter array (CFA) capable for application in image sensors, including a periodic pattern of dyes of different primary colors such as red (R), green (G) and blue (B) filters. The periodic pattern illustrated in FIG. 1 is a so-called Bayer pattern, including a red (R) filter, a blue (B) filter and a pair of green (G) filters. Moreover, FIG. 2 shows another conventional two-dimensional color filter array capable for application in image sensors, including a periodic pattern of different primary colors such as a cyan (Cy) filter, a magenta (Mg) filter and a pair of yellow (Ye) filters.

In conventional image sensors, undesired issues such as "color shading" may occur in image sensors with the previous mentioned structures and the color shading may be discovered when an image sensor is subjected to a chip probe (CP) test in which an image sensor is examined under a collimated white light. Color shading may occur in the photodiode or photoelectric conversion element of the image sensors when the photodiodes or the photoelectric conversion elements in the image sensor are formed in an irregular pattern rather than a radially symmetrical pattern due to line routing or other device design requirements. An image sensor, suffering from such a color shading issue, may be formed with "image shading" when applied in an optoelectronic device using the image sensor. Thus, causing the optoelectronic device to display abnormal images. Specifically, an uneven or imbalanced image profile presenting, for example, a red-deflected color, a blue-deflected color or other deflected colors at different portions of the image sensor may be formed.

FIG. 3 is a simulated image of an image sensor (not shown) incorporating a CFA arranged in the Bayer pattern illustrated in FIG. 1. The simulated images were obtained by a CP test using a collimated white light, wherein FIG. 3 shows an uneven image profile presenting a substantially yellow-deflected color at a relative upper region 130 of the image sensor and a substantially blue-deflected color at a relative lower region 200 of the image sensor, which are divided from a dotted line 150 formed therebetween. This uneven image profiles illustrated in FIG. 3 is the above described "color separation" and is not desirable in an image sensor because "image shading" may occur in an optoelectronic device employing said image sensor.

BRIEF SUMMARY OF THE INVENTION

The invention provides color filter arrays (CFA) and image sensors using the same for reducing or preventing color shading.

An exemplary embodiment of a color filter array comprises a plurality of first color filter patterns respectively interlaced with a plurality of second color filter patterns, wherein the first and second color filter patterns comprise a plurality of color filters of at least three different colors of red (R), green (G) and blue (B) filters, and the first and second color filter patterns are not mirror symmetrical, and a blue (B) filter in one of the first color filter patterns is adjoined by a red (R) filter in one of second color filter patterns adjacent thereto and/or a red (R) filter in one of the first color filter patterns is adjoined by a blue filter in one of the color filter patterns adjacent thereto.

An exemplary embodiment of an image sensor comprises a semiconductor substrate with a plurality of photoelectric conversion elements formed therein, a light shielding layer formed over the semiconductor substrate, having a plurality of opening areas, each exposing a part of the photodiode, a color filter array superimposed over the light-shielding layer, and a plurality of microlenses, superimposed over the color filter array, each covering the opening area of the underlying light shielding layer. In one embodiment, the color filer array comprises a plurality of first color filter patterns interlaced with a plurality of second color filter patterns, wherein the first and second color filter patterns comprise a plurality of color filters of at least three different colors of red (R), green (G) and blue (B) filters, and the first and second color filter patterns are not mirror symmetrical, and a blue (B) filter in one of the first color filter patterns is adjoined by a red (R) filter in one of second color filter patterns adjacent thereto and/or a red (R) filter in one of the first color filter patterns is adjoined by a blue filter in one of the color filter patterns adjacent thereto.

In another embodiment, the first and second color filter patterns comprise a plurality of color filters of at least three different colors of cyan (Cy), magenta (Mg) and yellow (Ye) filters, and the first and second color filter patterns are not mirror symmetrical, and a magenta (Mg) filter in one of the first color filter patterns is adjoined by a cyan (Cy) filter in one of second color filter patterns adjacent thereto and/or a cyan (Cy) filter in one of the first color filter patterns is adjoined by a magenta (Mg) filter in one of the color filter patterns adjacent thereto.

Another exemplary embodiment of a color filter array comprises a plurality of first color filter patterns respectively interlaced with a plurality of second color filter patterns, wherein the first and second color filter patterns comprise a plurality of color filters of at least three different colors of cyan (Cy), magenta (Mg) and yellow (Ye) filters, and the first and second color filter patterns are not mirror symmetrical, and a magenta (Mg) filter in one of the first color filter patterns is adjoined by a cyan (Cy) filter in one of second color filter patterns adjacent thereto and/or a cyan (Cy) filter in one of the first color filter patterns is adjoined by a magenta (Mg) filter in one of the color filter patterns adjacent thereto.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1 shows a conventional color filter array including a pattern of red (R), green (G) and blue (B) filters;

FIG. 2 shows another conventional color filter array including a pattern of cyan (Cy), magenta (Mg), yellow (Ye) filters;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
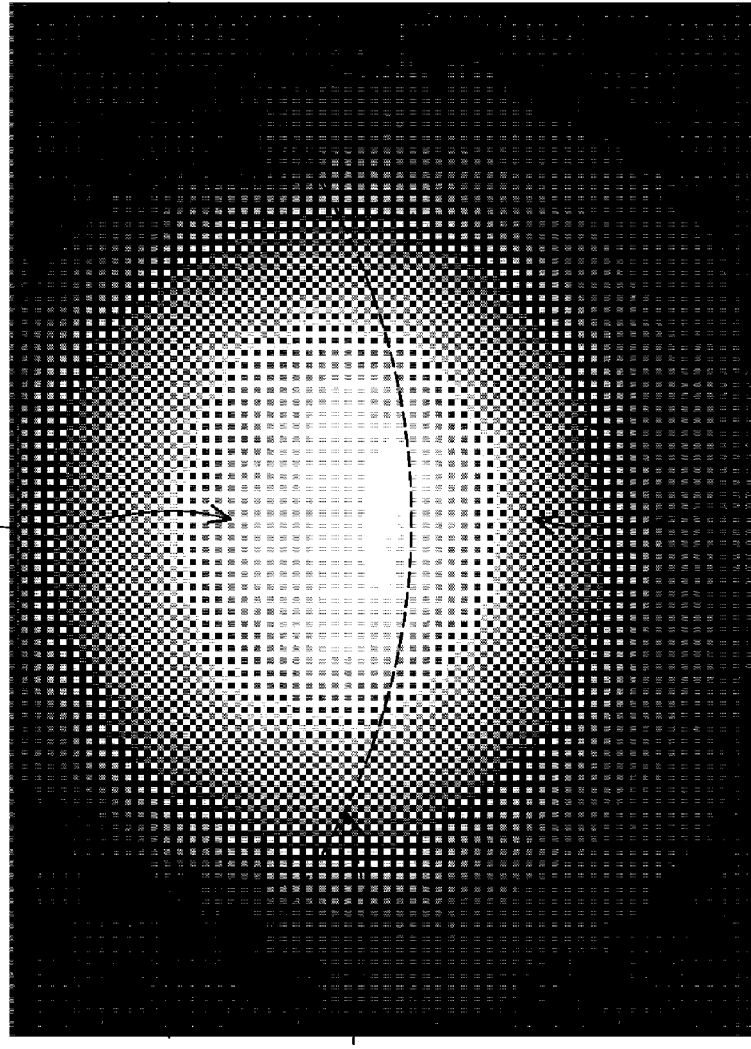
FIG. 3 shows a simulated image of an image sensor incorporating a conventional color filter array illustrated in FIG. 1.
Figure 4:
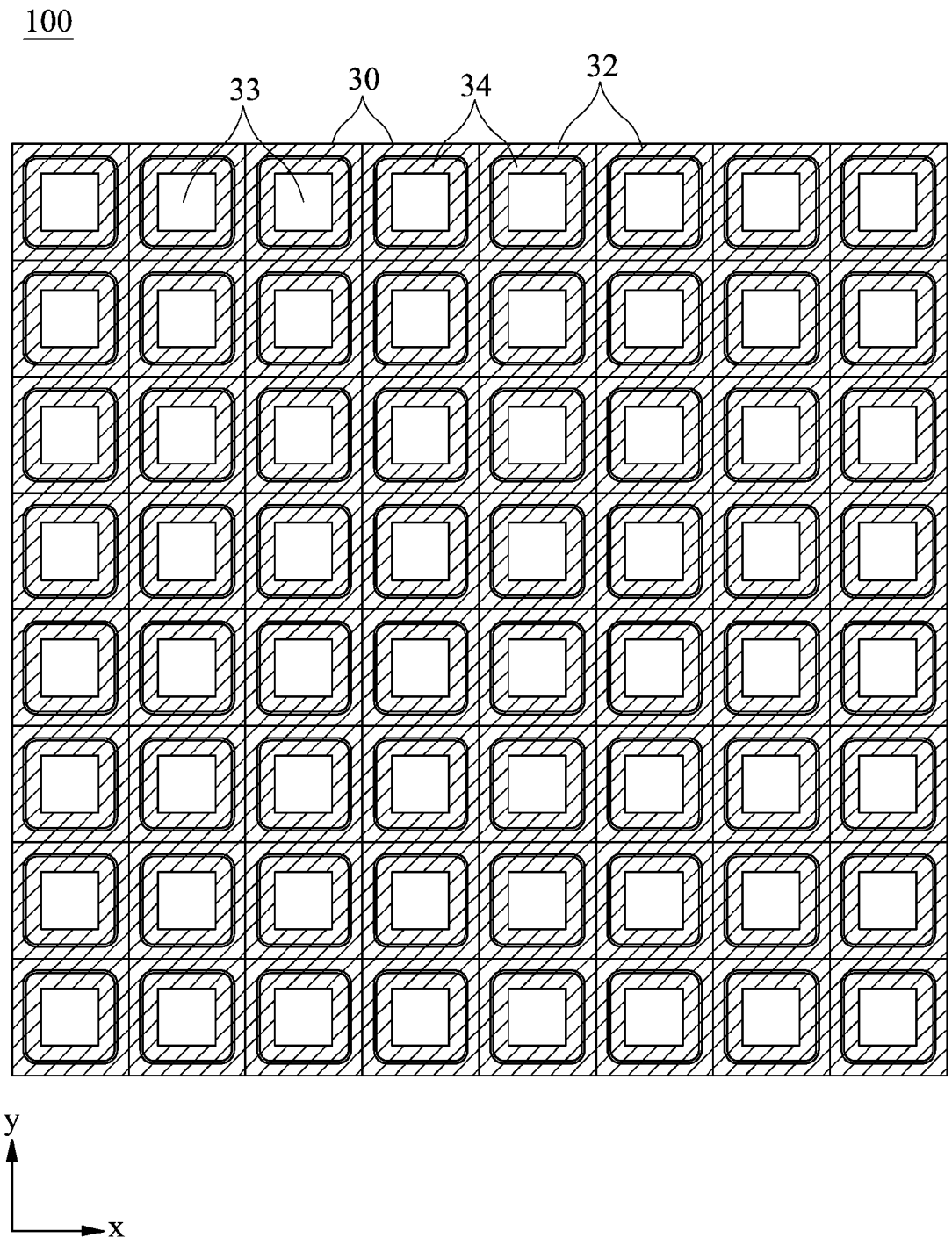
FIG. 4 is a schematic top view showing an image sensor according to an embodiment of the invention.
Figure 5:
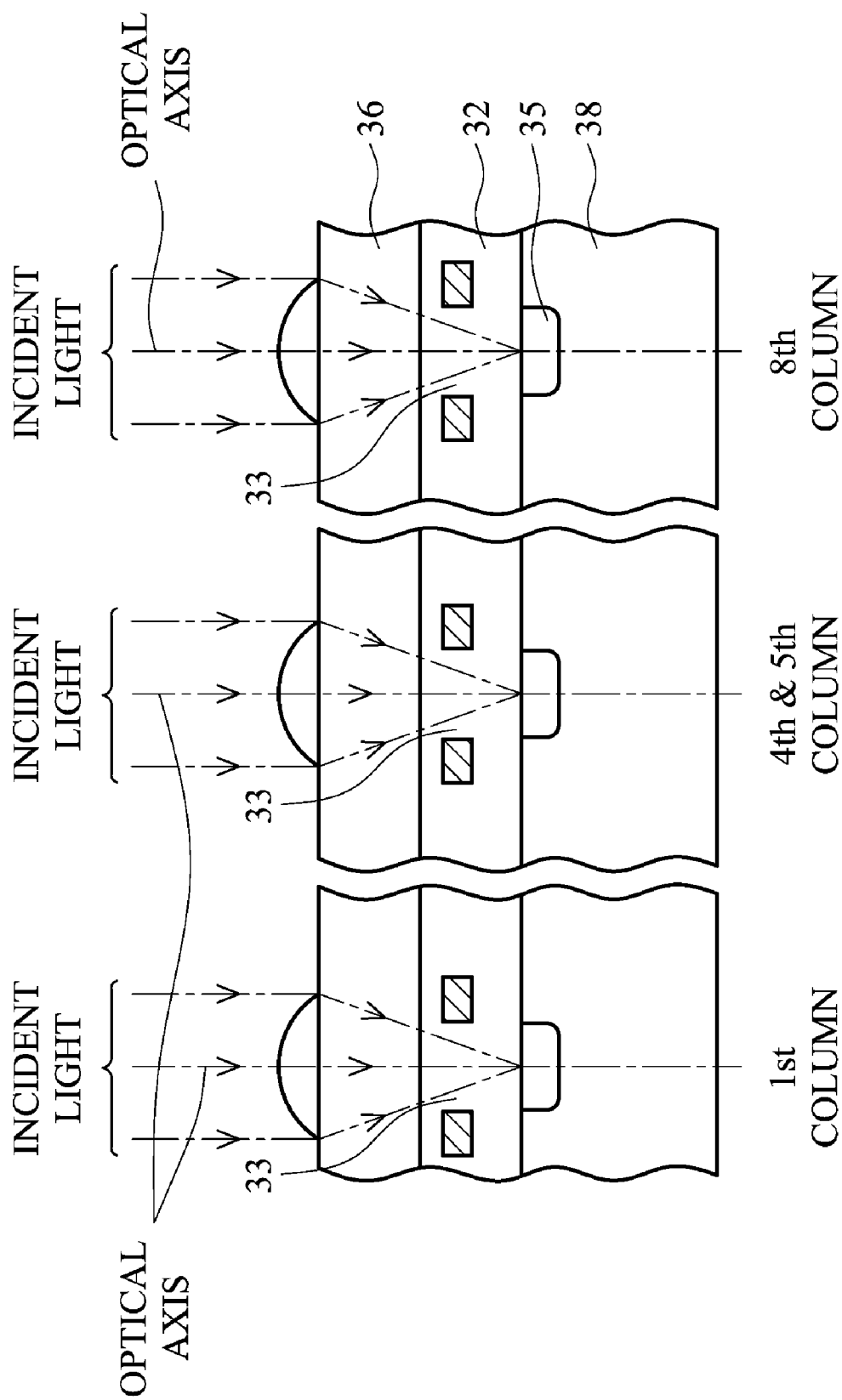
FIG. 5 is a cross sectional view of pixels in the first, fourth, fifth and eighth columns of the image sensor shown in FIG. 3.

FIGS. 4 and 5 are schematic diagrams showing an image sensor 100 according to an exemplary embodiment of the invention. In FIG. 4, a plan view of a pixel group of the image sensor 100 is illustrated. In FIG. 5, a cross sectional view showing pixels in the first, third/fourth and eighth columns of the pixel group in FIG. 4 is illustrated.

As shown in FIGS. 4 and 5, reference numeral 30 represents a pixel having a photodiode or photoelectric conversion element 35 formed in the surface layer of a semiconductor substrate (e.g. a Si substrate) 38. Due to line routing or other device design requirements, the photodiode or photoelectric conversion element 35 may be formed in an irregular pattern rather than a radially symmetrical pattern (not shown). Reference numeral 32 represents a light-shielding layer having a light-shielding area for shielding the area of the pixel 30 except for the photodiode 35. Reference numeral 33 represents an opening area formed through the light-shielding layer 32 through which light is incident upon the photodiode 35. Reference numeral 34 represents a microlens for converging light on the photodiode 35. Reference numeral 36 represents a color filter layer of red, green, blue, or other colors. Although, for the simplicity, an area of only 8×8 pixels is shown in FIG. 4, there are, in practice, several hundred thousands to several millions of two-dimensionally disposed pixels.

As shown in FIG. 5, the pixels 30 of the first column, the fourth and fifth column and the eighth column are illustrated to have a center of gravity for the microlens 34 and opening area 33 is substantially positioned at the center of gravity of the light reception area of the photodiode 35. Thus, incident light passing through the microlens 34 and being incident upon the photodiode 35 can be intercepted by the light-shielding area of the light-shielding layer.

Figure 6:
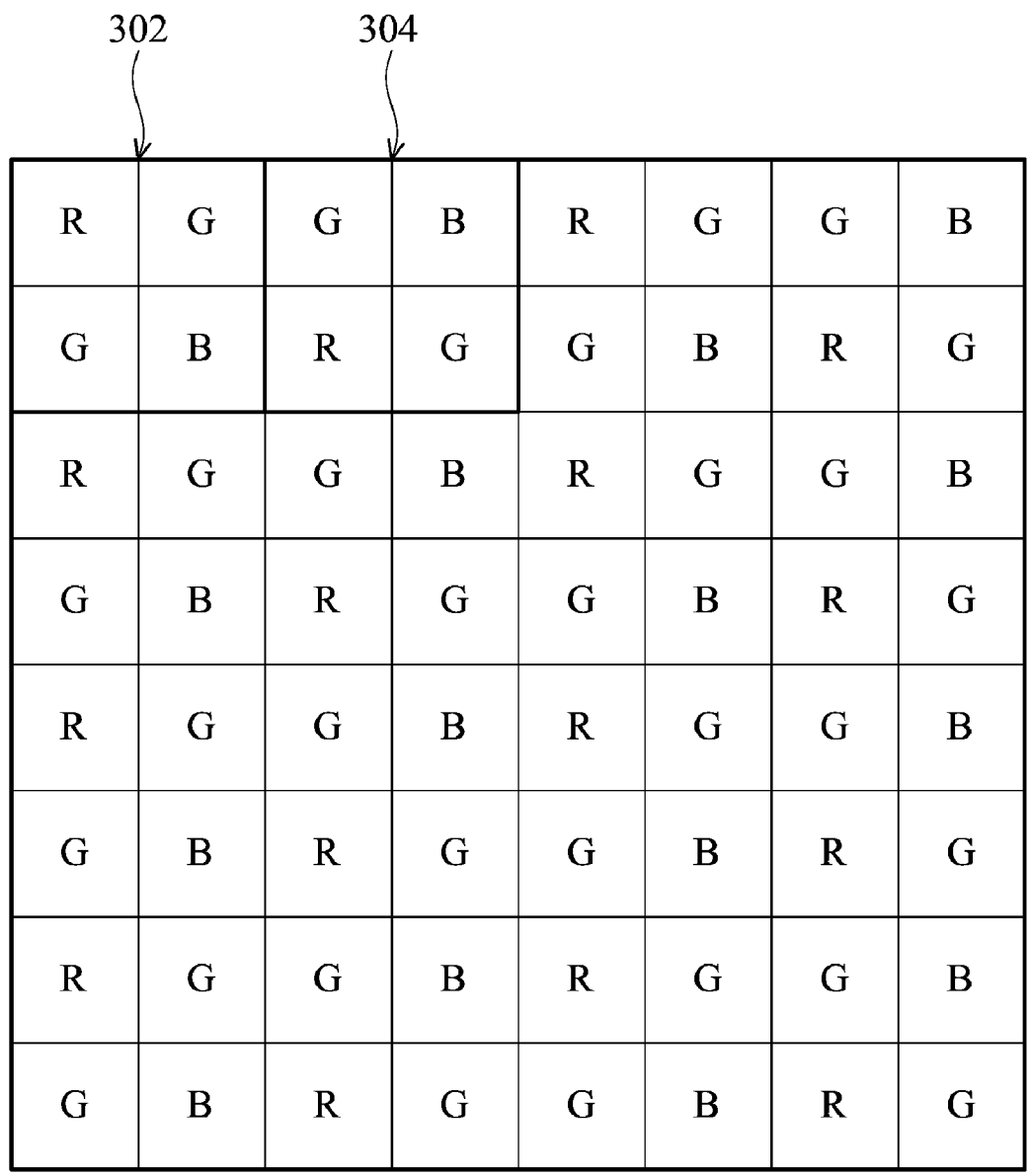
FIG. 6 shows a color filter array including a pattern of red (R), green (G) and blue (B) filters according to an embodiment of the invention.

FIG. 6 shows a color filter array including a periodic pattern of red (R), green (G) and blue (B) filters according to an embodiment of the invention. As shown in FIG. 6, an exemplary color filter array 300 for the color filter layer 36 is provided for the purpose of reducing or even preventing color shading issues for an image sensor using the color filter layer 36. The color filter array 300 is illustrated as a two-dimensional color filter array mainly formed of two different kinds of color filter patterns 302 and 304, each including a periodic pattern of dyes of different primary colors such as red (R), green (G) and blue (B) filters. The color filters 302 and 304 are interlaced and formed along a row direction (referring to an x direction in FIG. 6) and are repeatedly formed along a column direction (referring to a y direction in FIG. 6)

As shown in FIG. 6, the color filter pattern 302 of the color filter array 300 is illustrated as a conventional Bayer pattern which includes one R filter, one B filter, and a pair of G filters, and the color filter pattern 304 of the color filter array 300 is illustrated as a modified Bayer pattern configuration which includes one R filter, one B filter, and a pair of G filters, with a configuration different from the Bayer pattern configuration of the color filter pattern 302. In this embodiment, the modified Bayer pattern configuration in the color filter patterns 304 and the Bayer pattern configuration in the color filter patterns 302 are not mirror symmetrical. The blue (B) filter in one of the color filter patterns 302 may be adjoined with a red (R) filter in a color filter pattern 304 adjacent thereto and/or the red (R) filter in one of the color filter patterns 302 may be adjoined with a blue (B) filter in one of the color filter patterns 304 adjacent thereto. In this embodiment, the R filter, the B filter, and the G filter may be simultaneously co-existed along each row direction of the color filter array 300, as shown in FIG. 6.

Figure 7:
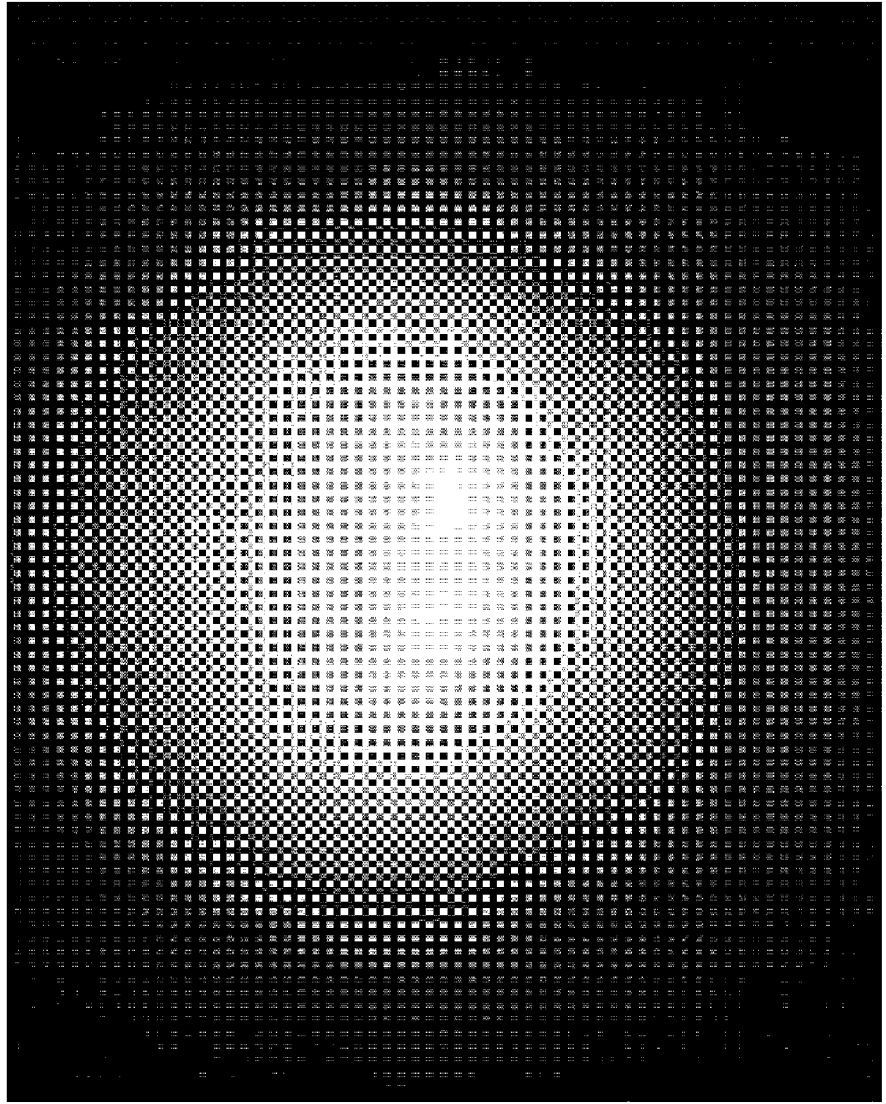
FIG. 7 shows a simulated image of an image sensor incorporating the color filter array illustrated in FIG. 6.

FIG. 7 shows a simulated image of an image sensor incorporating the CFA 300 illustrated in FIG. 6. The simulated image is obtained in a CP test using a collimated white light. As shown in FIG. 7, the simulated image shows an even image profile presenting no red-deflected color or other deflected colors in various portions of the image sensor, having no obvious borders for dividing various deflected colors regions therein. A symmetrical image profile with even color uniformity and color symmetry is obtained and the conventional color separation issue is thus reduced or even prevented. An image with better white balance can be also provided.

Thus, by using the exemplary color filter array 300 illustrated in FIG. 6 as a color filter layer of an image sensor, an even or balanced image profile presenting reduced or even no deflected colors can be obtained (as shown in FIG. 7). Thus, reducing or mitigating the conventional color shading issue.

Figure 8:
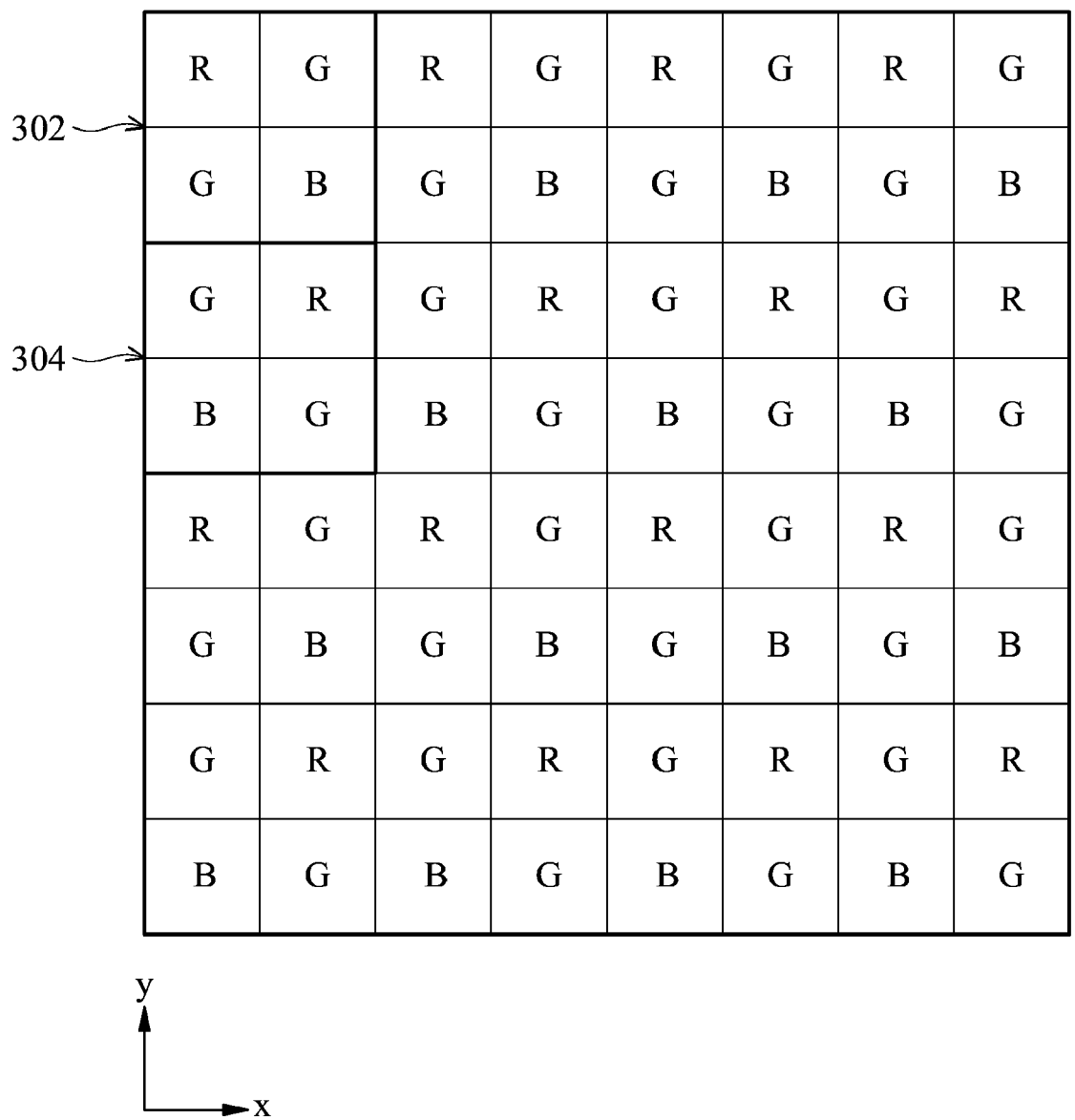
FIG. 8 shows a color filter array including a pattern of red (R), green (G) and blue (B) filters according to another embodiment of the invention

FIG. 8 shows another exemplary color filter array 300 according to another embodiment of the invention. In this embodiment, a layout of the color filter patterns 302 and 304 formed in the exemplary color filter array 300 is similar with that illustrated in FIG. 6 but the color filters 302 and 304 are interlaced and formed along a column direction (referring to a y direction in FIG. 8) and are repeatedly formed along a row direction (referring to an x direction in FIG. 8). In this embodiment, the modified Bayer pattern configuration in the color filter patterns 304 and the Bayer pattern configuration in the color filter patterns 302 are also not mirror symmetrical. The blue (B) filter in one of the color filter patterns 302 may be adjoined with the red (R) filter in a color filter pattern 304 adjacent thereto and/or the red (R) filter in one of the color filter patterns 302 may be adjoined with the blue (B) filter in one of the color filter patterns 304 adjacent thereto. In this embodiment, the R filter, the B filter, and the G filter may be simultaneously co-existed along a column direction of the color filter array 300, as shown in FIG. 8.

By using the exemplary color filter array 300 illustrated in FIG. 8 as a color filter layer of an image sensor, an even or balanced image profile presenting reduced or even no red-deflected color and/or no blue-deflected color can be obtained (not shown). Thus, reducing or mitigating the conventional color shading issue. Additionally, an image with better white balances can also be provided.

Figure 9:
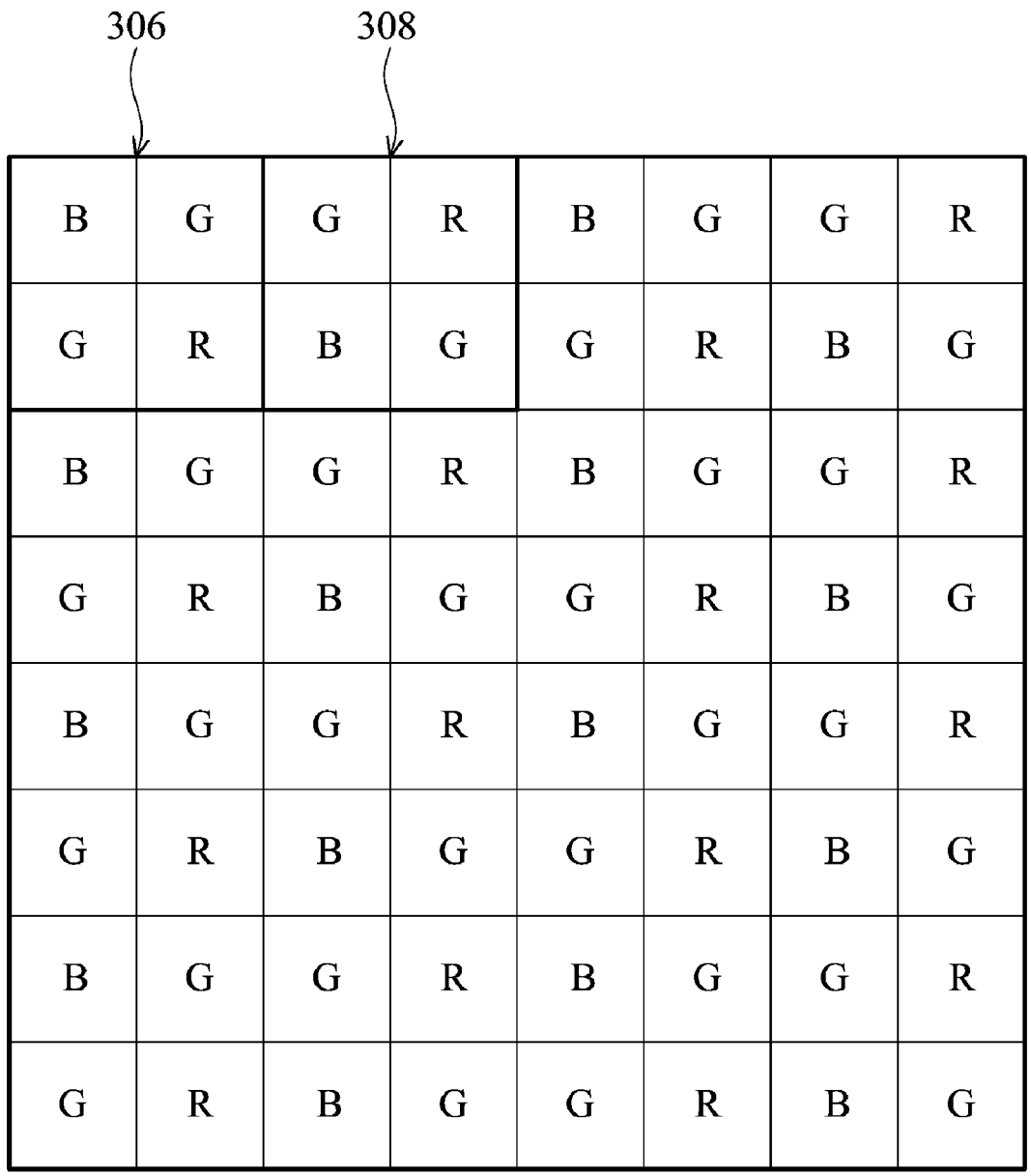
FIG. 9 shows a color filter array including a pattern of red (R), green (G) and blue (B) filters according to yet another embodiment of the invention

FIG. 9 shows a color filter array including a periodic pattern of red (R), green (G) and blue (B) filters according to another embodiment of the invention. As shown in FIG. 9, an exemplary color filter array 400 for the color filter layer 36 is provided for the purpose of reducing and mitigating color shading issues of an image sensor. The color filter array 400 is illustrated as a two-dimensional color filter array mainly formed of two different kinds of color filter patterns 306 and 308, wherein each include a periodic pattern of dyes of different primary colors such as red (R), green (G) and blue (B) filters. The color filters 306 and 308 are interlaced and formed along a row direction (referring to an x direction in FIG. 9) and are repeatedly formed along a column direction (referring to a y direction in FIG. 9)

As shown in FIG. 9, both of the color filter patterns 306 and 308 of the color filter array 400 are illustrated as modified Bayer patterns which includes one R filter, one B filter, and a pair of G filters of different configurations. The modified Bayer pattern configuration in the color filter patterns 306 and the modified Bayer pattern configuration in the color filter patterns 308 are not mirror symmetrical. The red (R) filter in one of the color filter patterns 306 may be adjoined the blue (B) filter in a color filter pattern 308 adjacent thereto and/or the blue (B) filter in one of the color filter patterns 306 may be adjoined the red (R) filter in one of the color filter patterns 308 adjacent thereto. In this embodiment, the R filter, the B filter, and the G filter may be simultaneously co-existed along a row of the color filter array 400, as shown in FIG. 9.

By using the exemplary color filter array 300 illustrated in FIG. 9 as a color filter layer of an image sensor, an even or balanced image profile presenting reduced or even no red-deflected color and/or no blue-deflected color can be obtained (not shown). Thus, reducing or mitigating the conventional color shading issue. Additionally, an image with better white balances can also be provided.

Figure 10:
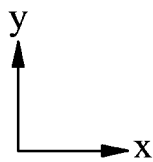
FIG. 10 shows a color filter array including a pattern of red (R), green (G) and blue (B) filters according to another embodiment of the invention.
Figure 11:
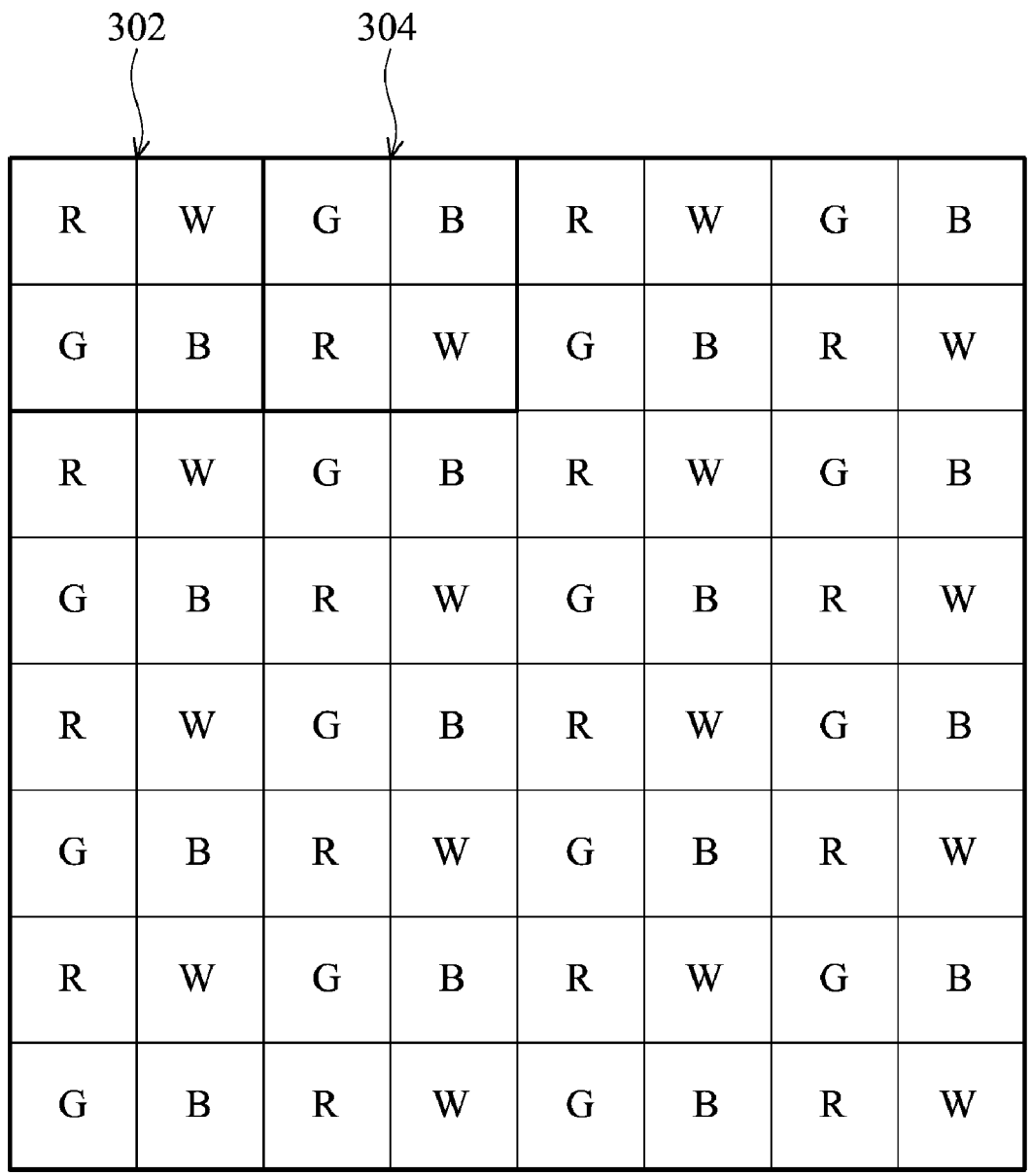
FIGS. 11-14 respectively shows an arrangement of a color filter array including a pattern of red (R), green (G), blue (B) and white (W) filters according to various embodiments of the invention.
Figure 12:
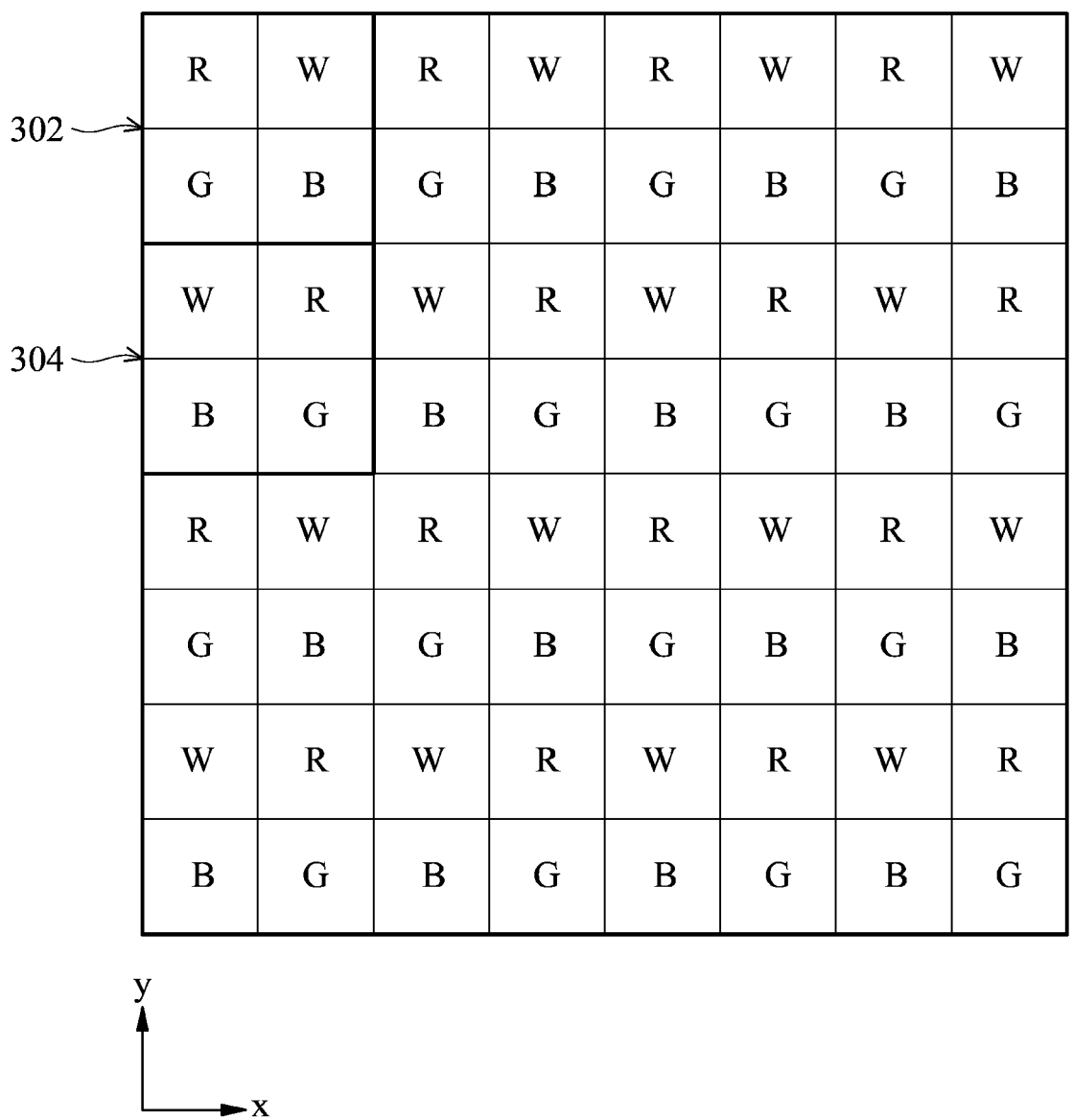
Figure 13:
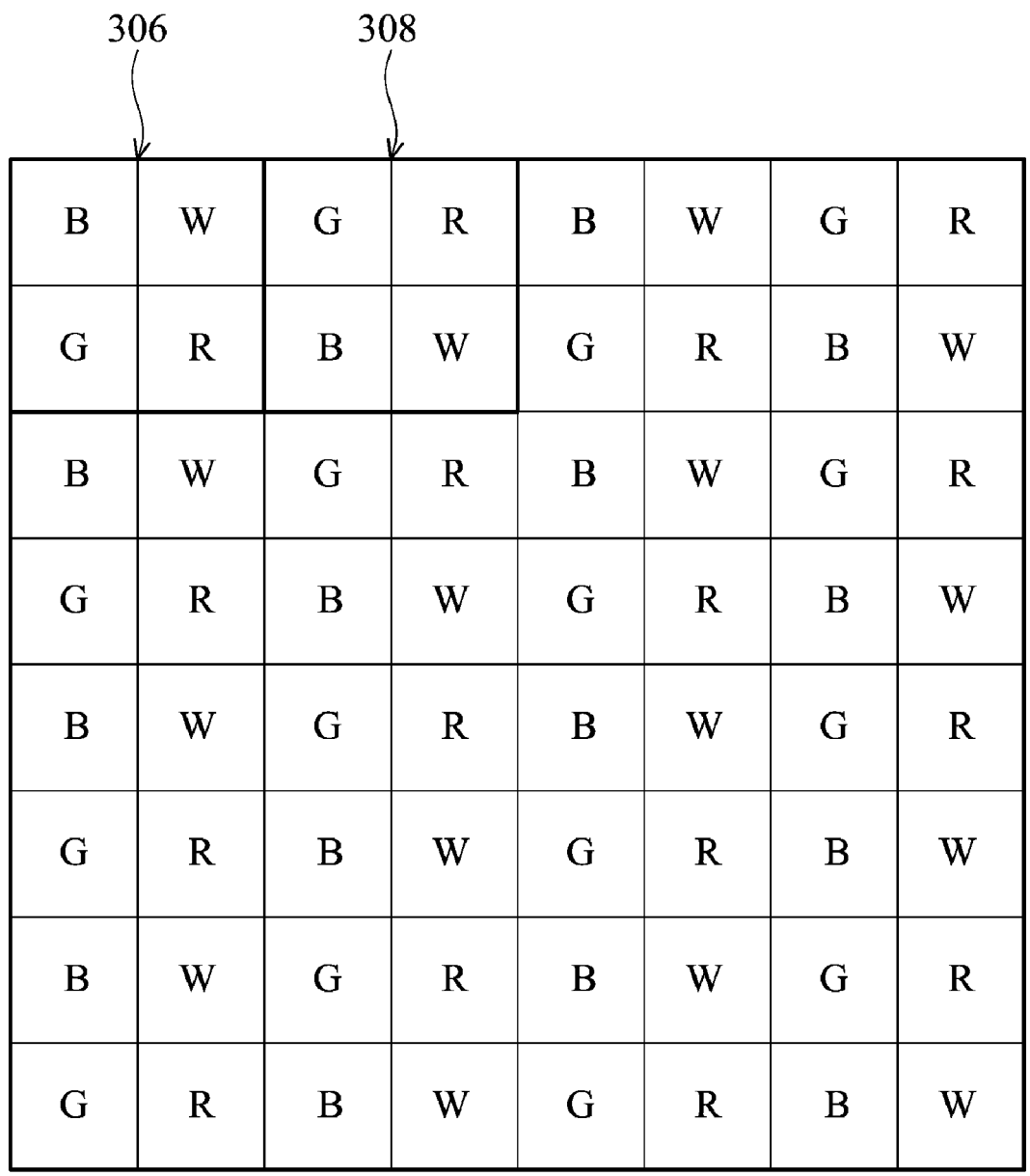
Figure 13:
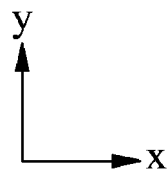
Figure 14:
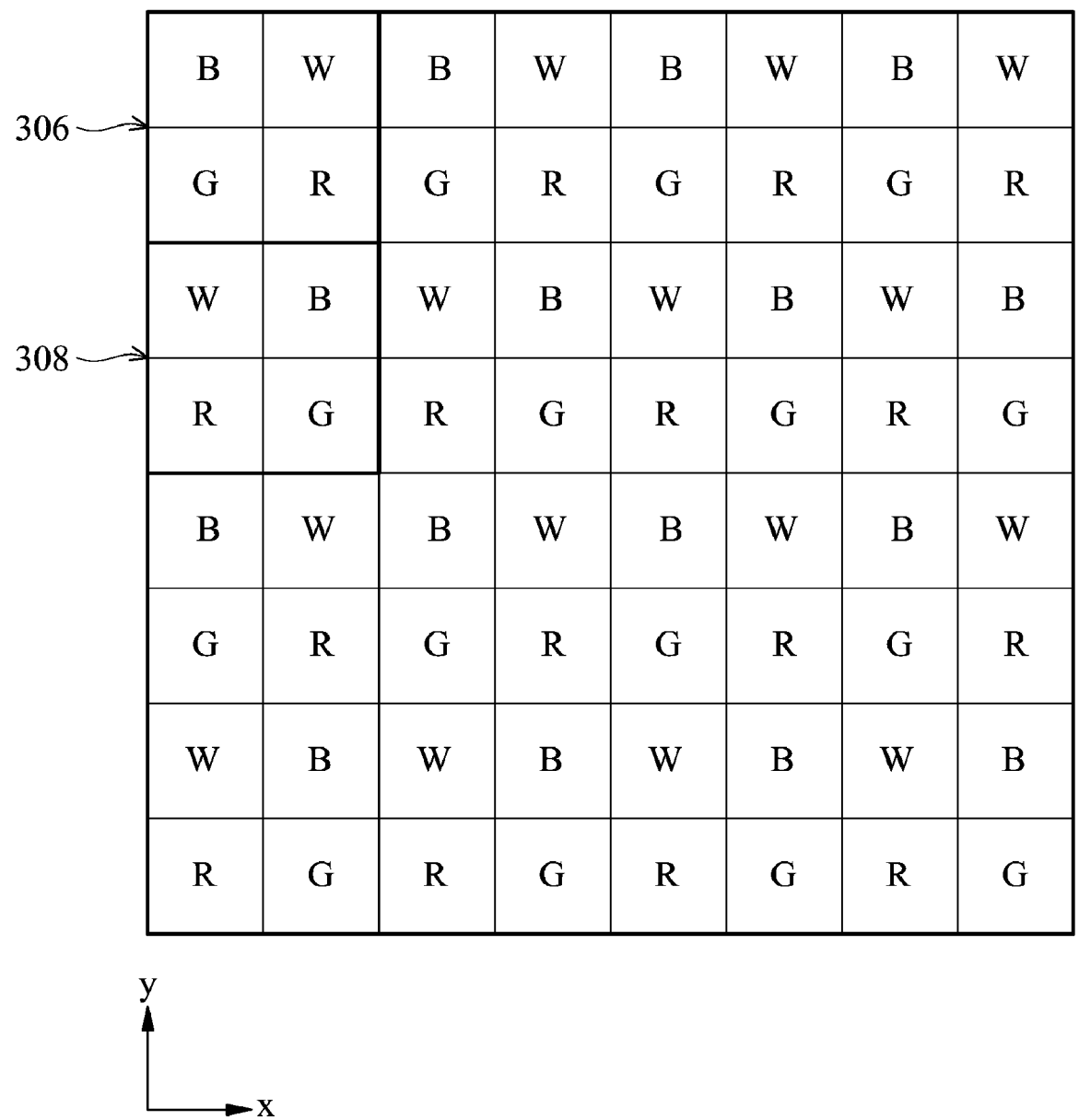

FIG. 10 shows an exemplary color filter array 400 according to another embodiment of the invention. In this embodiment, a layout of the color filter patterns 306 and 308 formed in the exemplary color filter array 400 is similar with that illustrated in FIG. 9, and the color filters 306 and 308 are interlaced and formed along a column direction (referring to a y direction in FIG. 10) and are repeatedly formed along a row direction (referring to an x direction in FIG. 10). In this embodiment, the modified Bayer pattern configuration in the color filter patterns 306 and the modified Bayer pattern configuration in the color filter patterns 308 are also not mirror symmetrical. The red (R) filter in one of the color filter patterns 306 may be adjoined with the blue (B) filter in a color filter pattern 308 adjacent thereto and/or the blue (R) filter in one of the color filter patterns 306 may be adjoined with the red (R) filter in one of the color filter patterns 308 adjacent thereto. In this embodiment, the R filter, the B filter, and the G filter may be simultaneously co-existed along a column direction of the color filter array 400, as shown in FIG. 10.

By using the exemplary color filter array 400 illustrated in FIG. 10 as a color filter layer of an image sensor, an even or balanced image profile presenting reduced or even no red-deflected color and/or no blue-deflected color can be obtained (not shown). Thus, reducing or mitigating the conventional color shading issue. Additionally, an image with better white balances can also be provided.

The color filter arrays 300 and 400 illustrated in FIGS. 6, 8, 9, and 10 are illustrated as two-dimensional color filter arrays including a periodic pattern of red (R), green (G) and blue (B) filters and are not limited thereto. The color filter arrays 300 and 400 illustrated in FIGS. 6, 8, 9, and 10 can additionally be a two-dimensional color filter array including a periodic pattern of other primary colors of cyan (Cy), magenta (Mg), and yellow (Ye) filters. The red pattern can be substituted by the cyan pattern, the green pattern can be substituted by the yellow pattern and the blue pattern can be substituted by the magenta pattern.

Moreover, the color filter arrays 300 and 400 illustrated in FIGS. 6, 8, 9, and 10 can additionally be a two-dimensional color filter array including a periodic pattern of different colors of red (R), green (G), blue (B) and white (W) filters, as the various embodiments respectively illustrates in FIGS. 10-14. In other embodiments, the color filter arrays 300 illustrated in FIGS. 10-14 can additionally be a two-dimensional color filter array including a periodic pattern of different colors of cyan (Cy), magenta (Mg), yellow (Ye) and green (G) filters (not shown). The red pattern can be substituted by the cyan pattern, the green pattern can be substituted by the yellow pattern, the blue pattern can be substituted by the magenta pattern and the white pattern can be substituted by the green pattern.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A color filter array, comprising:
a plurality of first color filter patterns respectively interlaced with a plurality of second color filter patterns along a column direction, each of the first and second color filter patterns comprising a 2 by 2 array formed by a red (R), a green (G) and a blue (B) filters, wherein the blue (B) filter in one of the first color filter patterns physically contacts the red (R) filter in one of second color filter patterns adjacent thereto, and wherein the red (R) filter, the blue (B) filter, and the green (G) filter simultaneously co-exist along a row direction of the color filter array.

2. The color filter array as claimed in claim 1, wherein the first and second color filter patterns are repeatedly formed along a row direction of the color filter array.

3. The color filter array as claimed in claim 1, the 2 by 2 array further comprises a white filter.

4. The color filter array as claimed in claim 1, wherein the green (G) filter in one of the first color filter patterns physically contacts the blue (B) filter or the red (R) filter in one of the second color filter patterns adjacent thereto along a column direction.

5. The color filter array as claimed in claim 1, wherein the green (G) filter in one of the first color filter patterns physically contacts the green (G) filter in one of the second color filter patterns adjacent thereto along a row direction.

6. An image sensor, comprising:
   a semiconductor substrate with a plurality of photoelectric conversion elements formed therein;
   a light shielding layer formed over the semiconductor substrate, having a plurality of opening areas, each exposing a part of the photodiode;
   a color filter array superimposed over the light-shielding layer, wherein the color filer array comprises:
   a plurality of first color filter patterns interlaced with a plurality of second color filter patterns along a column direction, each of the first and second color filter patterns comprising a 2 by 2 array formed by a red (R), a green (G) and a blue (B) filters, wherein the blue (B) filter in one of the first color filter patterns physically contacts the red (R) filter in one of second color filter patterns adjacent thereto, and the red (R) filter, the blue (B) filter, and the green (G) filter simultaneously co-exist along a row direction of the color filter array;
   and
   a plurality of microlenses, superimposed over the color filter array, each covering the opening area of the underlying light shielding layer.

7. The image sensor as claimed in claim 6, wherein the first and second color filter patterns are repeatedly formed along a row direction of the color filter array.

8. The image sensor as claimed in claim 6, wherein the 2 by 2 array further comprises a white filter.

9. The image sensor as claimed in claim 6, wherein the photoelectric conversion elements are CMOS image sensing elements or CCD image sensing elements.

10. The color filter array as claimed in claim 6, wherein the green (G) filter in one of the first color filter patterns physically contacts the blue (B) filter or the red (R) filter in one of the second color filter patterns adjacent thereto along a column direction.

11. The color filter array as claimed in claim 6, wherein the green (G) filter in one of the first color filter patterns physically contacts the green (G) filter in one of the second color filter patterns adjacent thereto along a row direction.

12. A color filter array, comprising:
   a plurality of first color filter patterns respectively interlaced with a plurality of second color filter patterns along a column direction, each of the first and second color filter patterns comprising a cyan (Cy), magenta (Mg) and yellow (Ye) filters, wherein the magenta (Mg) filter in one of the first color filter patterns physically contacts the cyan (Cy) filter in one of second color filter patterns adjacent thereto, and wherein the cyan (Cy), magenta (Mg) and yellow (Ye) filters simultaneously co-exist along a row direction of the color filter array.

13. The color filter array as claimed in claim 12, wherein the first and second color filter patterns are repeatedly formed along a row direction of the color filter array.

14. The color filter array as claimed in claim 12, wherein the first and second color filter patterns further comprise a plurality of color filters of green (G) color.

15. The color filter array as claimed in claim 12, wherein the yellow (Ye) filter in one of the first color filter patterns physically contacts the magenta (Mg) filter or the cyan (Cy) filter in one of the second color filter patterns adjacent thereto along a column direction.

16. The color filter array as claimed in claim 12, wherein the yellow (Ye) filter in one of the first color filter patterns physically contacts the yellow (Ye) filter in one of the second color filter patterns adjacent thereto along a row direction.

17. An image sensor, comprising:
   a semiconductor substrate with a plurality of photoelectric conversion elements formed therein;
   a light shielding layer formed over the semiconductor substrate, having a plurality of opening areas, each exposing a part of the photodiode;
   a color filter array superimposed over the light-shielding layer, wherein the color filer array comprises:
   a plurality of first color filter patterns interlaced with a plurality of second color filter patterns along a column direction, each of the first and second color filter patterns comprising a cyan (Cy), magenta (Mg) and yellow (Ye) filters, wherein the magenta (Mg) filter in one of the first color filter patterns physically contacts the cyan (Cy) filter in one of second color filter patterns adjacent thereto, and wherein the cyan (Cy), magenta (Mg) and yellow (Ye) filters simultaneously co-exist along a row direction of the color filter array;
   and
   a plurality of microlenses, superimposed over the color filter array, each covering the opening area of the underlying light shielding layer.

18. The image sensor as claimed in claim 17, wherein the first and second color filter patterns are repeatedly formed along a row direction of the color filter array.

19. The image sensor as claimed in claim 17, wherein the first and second color filter patterns further comprise a plurality of color filters of green (G) color.

20. The image sensor as claimed in claim 17, wherein the photoelectric conversion elements are complementary metal oxide semiconductor (CMOS) image sensing elements or charge coupled device (CCD) image sensing elements.

21. The color filter array as claimed in claim 17, wherein the yellow (Ye) filter in one of the first color filter patterns physically contacts the magenta (Mg) filter or the cyan (Cy) filter in one of the second color filter patterns adjacent thereto along a column direction.

22. The color filter array as claimed in claim 17, wherein the yellow (Ye) filter in one of the first color filter patterns physically contacts the yellow (Ye) filter in one of the second color filter patterns adjacent thereto along a row direction.

* * * * *